United States Patent
Sakai

(10) Patent No.: US 7,514,281 B2
(45) Date of Patent: Apr. 7, 2009

(54) METHOD FOR MANUFACTURING ORGANIC ELECTROLUMINESCENCE DEVICE AND ELECTRONIC APPARATUS

(75) Inventor: Hirofumi Sakai, Suwa (JP)

(73) Assignee: Seiko Epson Corporation, Toyko (JP)

( * ) Notice: Subject to any disclaimer, the term of this patent is extended or adjusted under 35 U.S.C. 154(b) by 325 days.

(21) Appl. No.: 11/104,625

(22) Filed: Apr. 13, 2005

(65) Prior Publication Data

US 2005/0239226 A1 Oct. 27, 2005

(30) Foreign Application Priority Data

Apr. 27, 2004 (JP) ............................ 2004-130867

(51) Int. Cl.
*H01L 21/00* (2006.01)
*H01L 35/24* (2006.01)
(52) U.S. Cl. .......................................... 438/29; 257/40
(58) Field of Classification Search .................. 438/29, 438/22; 313/504, 506; 430/321; 365/111; 257/40
See application file for complete search history.

(56) References Cited

U.S. PATENT DOCUMENTS

| 6,828,727 B2* | 12/2004 | Yamazaki | 313/509 |
|---|---|---|---|
| 6,949,328 B2* | 9/2005 | Ito et al. | 430/321 |
| 7,164,455 B2* | 1/2007 | Takagi et al. | 349/114 |
| 2003/0137557 A1* | 7/2003 | Nakamura | 347/44 |
| 2004/0021413 A1* | 2/2004 | Ito et al. | 313/504 |
| 2004/0174469 A1* | 9/2004 | Takagi et al. | 349/57 |
| 2004/0232814 A1* | 11/2004 | Sakai | 313/310 |
| 2005/0236983 A1* | 10/2005 | Sakai et al. | 313/506 |
| 2005/0237780 A1* | 10/2005 | Sakai | 365/111 |

FOREIGN PATENT DOCUMENTS

| JP | A 11-87063 | 3/1999 |
|---|---|---|
| JP | A-2000-243577 | 9/2000 |
| JP | A-2003-077652 | 3/2003 |
| JP | A-2003-142259 | 5/2003 |
| JP | A-2003-283102 | 10/2003 |
| JP | A-2003-347048 | 12/2003 |
| JP | A-2004-514256 | 5/2004 |
| JP | A-2004-516641 | 6/2004 |
| JP | A 2004-303698 | 10/2004 |
| JP | A 2004-303699 | 10/2004 |
| JP | A 2004-303700 | 10/2004 |
| JP | A 2004-362819 | 12/2004 |
| WO | WO 02/41400 A1 | 5/2002 |
| WO | WO 02/052660 A1 | 7/2002 |

* cited by examiner

*Primary Examiner*—Thanh Nguyen
(74) *Attorney, Agent, or Firm*—Oliff & Berridge, PLC

(57) ABSTRACT

A method for manufacturing an organic electroluminescence device, including: forming partitions sandwiching a film-forming area above a substrate; forming a boundary section in the proximity of said partitions; and ejecting droplets containing an electrode forming material into said film-forming area defined by said partitions and said boundary section.

8 Claims, 14 Drawing Sheets

METHOD FOR MANUFACTURING ORGANIC ELECTROLUMINESCENCE DEVICE AND ELECTRONIC APPARATUS

BACKGROUND OF THE INVENTION

1. Field of the Invention

The present invention relates to a method for manufacturing an organic electroluminescence device, and to an electronic apparatus.

Priority is claimed on Japanese Patent Application No. 2004-130867, filed Apr. 27, 2004, the content of which is incorporated herein by reference.

2. Description of the Related Art

Recently, in electronic apparatus such as notebook PCs, mobile phones and personal digital assistances, a display unit such as an organic electroluminescence (hereinafter, referred to as an organic EL) device has been proposed, which includes organic EL elements corresponding to pixels, as a means for displaying information.

One of such organic EL devices is an organic EL device of a passive matrix type. The passive matrix type organic EL device generally includes a plurality of first electrodes extending in a predetermined direction in a strip shape on a substrate, a plurality of second electrodes arranged in a direction orthogonal to the first electrodes, and organic functional layers vertically sandwiched between the first and the second electrodes at intersection areas of the first and the second electrodes. The organic functional layer includes a light-emitting layer which emits light when an electric current flows to the first and the second electrodes, and the passive matrix type organic EL device is formed by including a plurality of organic functional layers including the light emitting layer, corresponding to one pixel.

The second electrode of the passive matrix type organic EL device is generally formed by vacuum evaporation. According to this vacuum evaporation, as is well known (for example, Japanese Unexamined Patent Application, First Publication No. H11-87063), a separator is provided in a predetermined thickness between the areas where the second electrodes are formed, so that the second electrodes are separated from each other by depositing a second electrode material on the surface of the substrate from a vertical direction or an oblique direction. When the organic functional layer is formed by a droplet ejection method, the material of the organic functional layer is ejected on the first electrode exposed between the separators, and dried to form the organic functional layer.

In the conventional method however, there are problems as described below.

In general, when the film thickness is increased when a film is formed by the vacuum evaporation method, the film may peel off due to film stress, or the light-emitting layer may deteriorate due to radiant heat from the deposition source due to long-time film forming. Therefore, the film thickness of a cathode film-formed by the vacuum evaporation method is restricted to a thin film. As a result, the electric resistance of the electrode inevitably increases.

When the electric resistance of the cathode is large, voltage applied to the organic EL device decreases more due to voltage drop, the closer to the center of the display region, thereby causing luminance unevenness. This voltage drop is noticeable particularly in the case of a large organic EL display unit, thereby causing a problem in that the display quality decreases.

Therefore, studies have been made to form the film of the electrode by, for example, a droplet ejection method. The droplet ejection method is for forming a linear electrode by providing a plurality of partitions, leaving a space therebetween, and ejecting and baking droplets including conductive minute particles into a film-forming area between these partitions. According to this method, the electric resistance can be reduced by increasing the film thickness of the electrode, as compared to the deposition method.

In this configuration however, the droplets flow out from the film-forming area, and the adjacent electrodes formed with the partition therebetween may come in contact with each other at the end portions of the partitions in the lengthwise direction. In this case, the electrodes are electrically connected causing a short-circuit.

SUMMARY OF THE INVENTION

In view of the above situation, it is an object of the present invention to provide a method for manufacturing an organic EL device, which can prevent short circuit caused by contact of electrodes formed by the droplet ejection method, and an electronic apparatus manufactured according to this manufacturing method.

In order to achieve the above objects, the present invention has the following configuration.

The method for manufacturing an organic electroluminescence device according to the present invention includes: forming partitions sandwiching a film-forming area above a substrate, and ejecting droplets containing an electrode forming material into the film-forming area, and further includes forming a boundary section which separates the film forming area from a non-film forming area near an end portion of the partition, and prevents the ejected droplets from flowing out.

Consequently, in the present invention, the droplets ejected to the film-forming area between the partitions are prevented from flowing out from the film-forming area by the boundary section. As a result, droplets ejected to adjacent film-forming areas separated by the partition can be kept from coming into contact with each other and causing a short circuit.

A liquid-repellent film having liquid repellency with respect to the droplets, or a second partition, which connects the end portions of the partitions arranged sandwiching the film-forming area, may be used as the boundary sections.

When the boundary section is formed by the second partition, the manufacturing steps can be reduced by forming the partitions and the second partition in the same step, thereby contributing to an improvement in productivity.

The partitions may be formed in a reversed tapered shape, with the width of the partition gradually enlarged upward.

Moreover, a procedure in which ejecting the droplets into the film-forming area, and drying and baking the ejected droplets are repeated several times can be preferably adopted.

In this case, the film thickness of the electrode can be further increased, thereby further reducing the electric resistance in the electrode.

On the other hand, the electronic apparatus of the present invention is provided with an organic EL device manufactured by the above mentioned manufacturing method for an organic EL device.

Consequently, according to the present invention, an electronic apparatus having excellent display quality, in which the film-formed electrodes are not short-circuited, and luminance unevenness does not occur, can be obtained.

DETAILED DESCRIPTION OF THE INVENTION

One embodiment of an organic EL device and a manufacturing method thereof, and an electronic apparatus, according to the present invention will be described hereunder, with reference to the drawings. In the respective drawings referenced, the scale may be different for each layer and each member, for clarity of illustration.

First Embodiment

Figure 1:
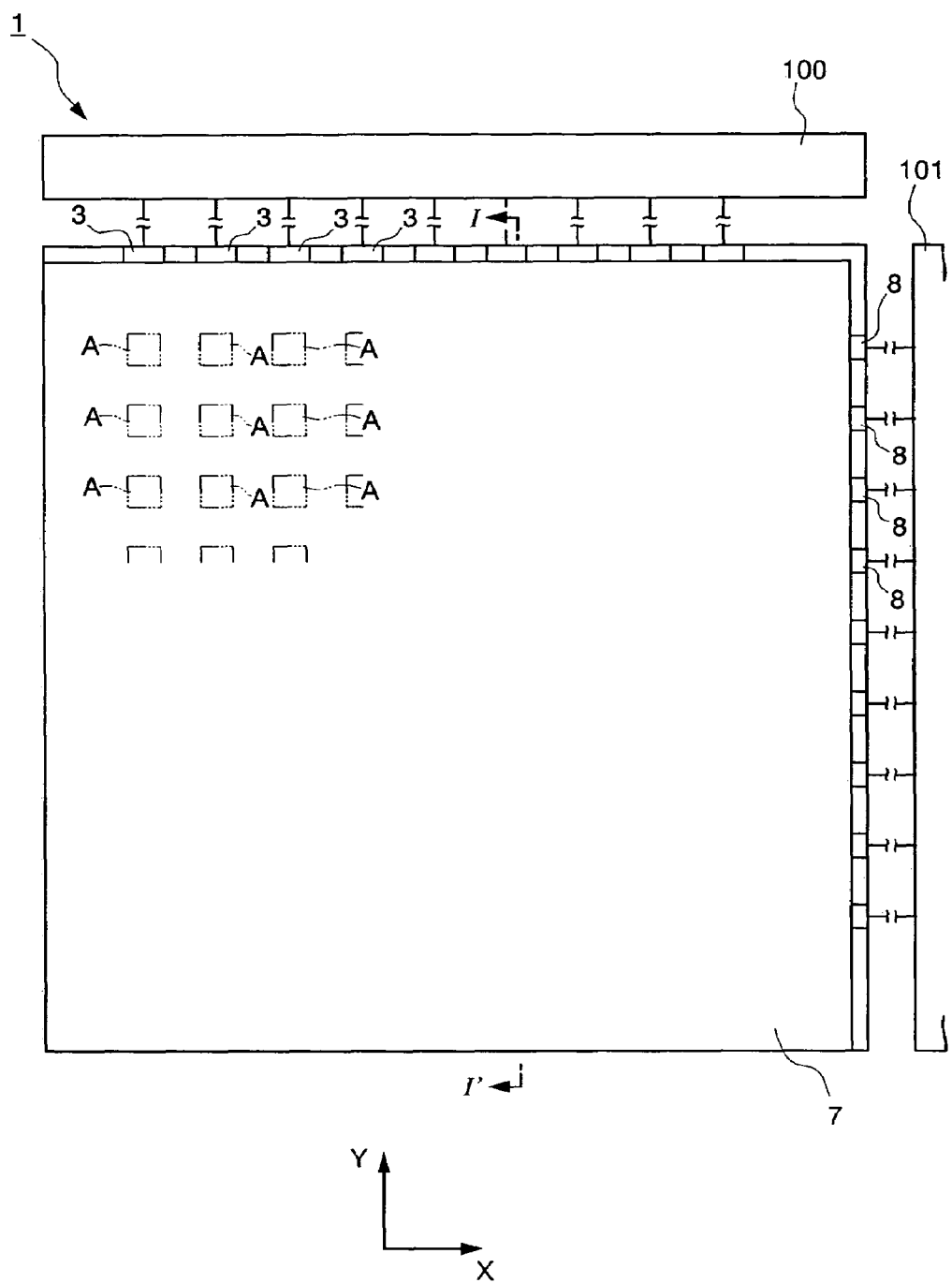
FIG. 1 is a plan view of an organic EL device of the present invention.
Figure 2:
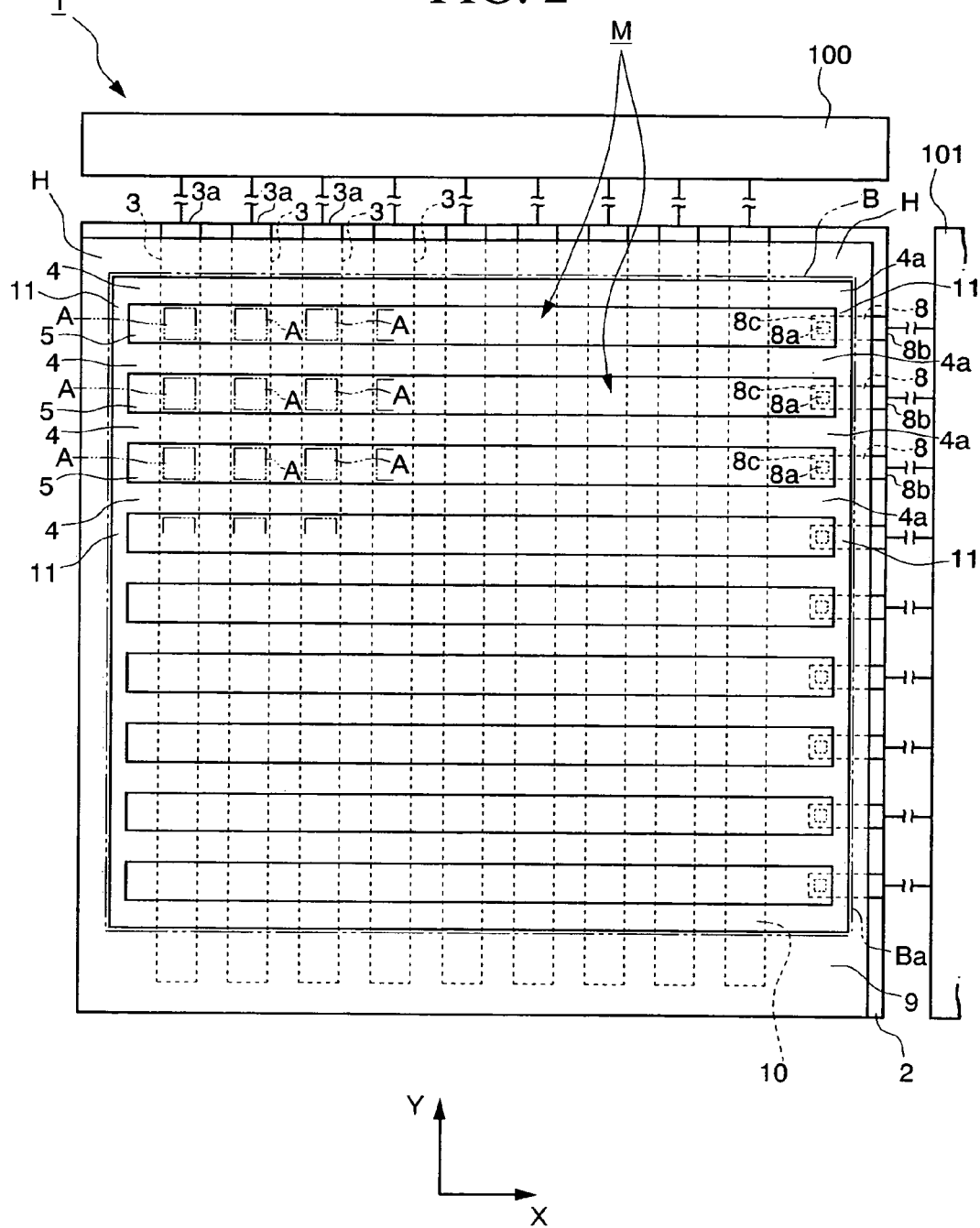
FIG. 2 is a schematic inner view of the organic EL device of the present invention.
Figure 3:
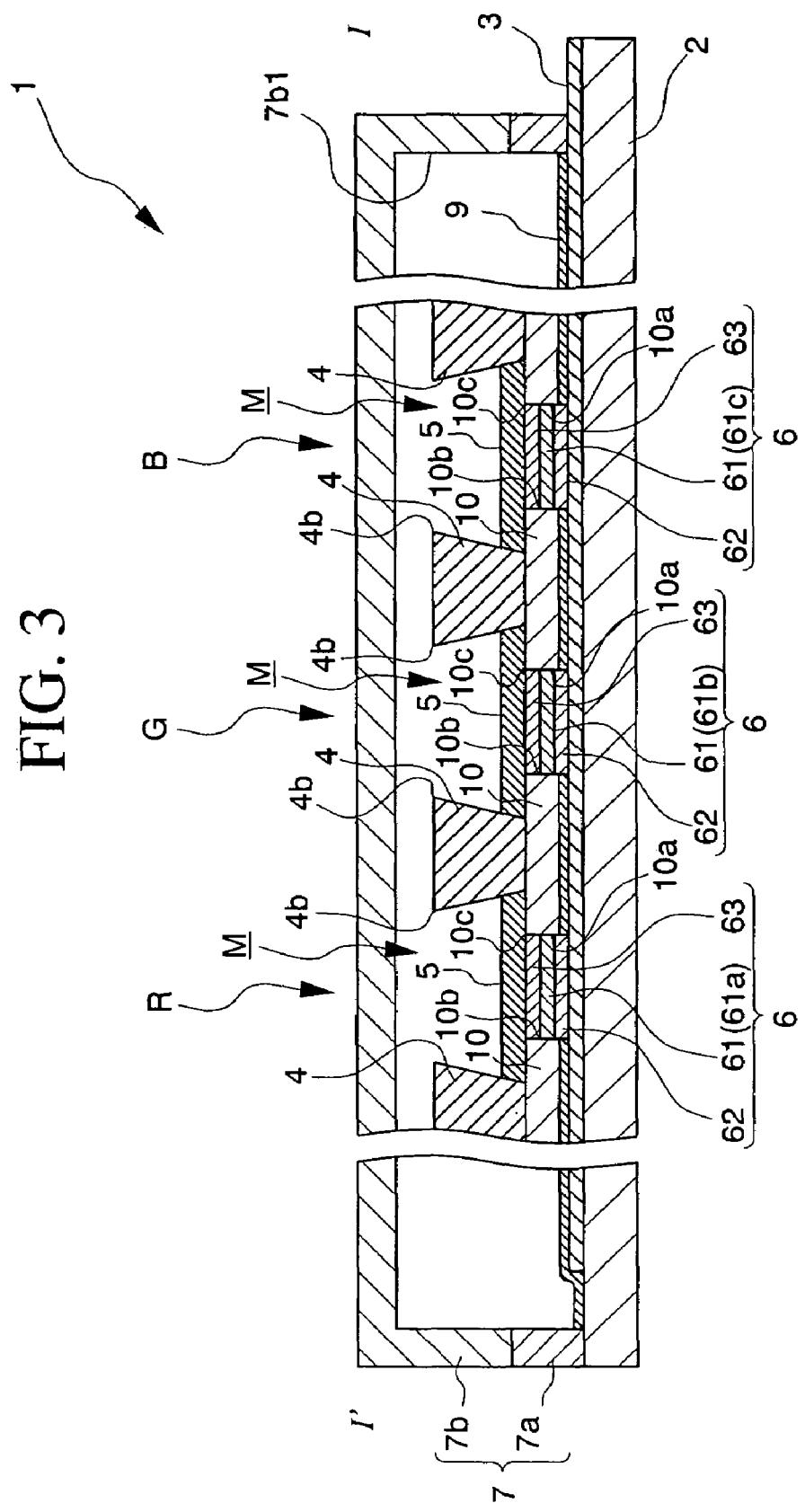
FIG. 3 is a cross-sectional view in taken along the line I-I' in FIG. 1.

FIG. 1 to FIG. 3 are diagrams schematically showing a passive matrix type organic EL (electroluminescence) display unit according to a first embodiment. FIG. 1 is a plan view, FIG. 2 is a schematic inner view of the organic EL device 1, and FIG. 3 is a cross-sectional view taken along the line I-I' in FIG. 1.

As shown in these figures, the organic EL device 1 includes, as main components; a plurality of first electrodes (anodes) 3 extending in a predetermined direction (in a Y-axis direction) in a strip shape on a substrate 2, a plurality of cathode separators (partitions) 4 extending in a direction orthogonal to the extending direction of the first electrodes (in an X-axis direction), bank layers 10 arranged below the cathode separators 4, second electrodes (cathodes) 5 formed in film-forming areas between the cathode separators 4, organic functional layers 6 vertically placed between the first electrodes 3 and the second electrodes 5 in areas (light-emitting areas) where the first electrodes 3 and the second electrodes 5 cross each other, and a sealing portion 7 for can-sealing the first electrodes 3, the cathode separators 4, the second electrodes 5 and the organic functional layers 6, and the like.

In FIG. 2, reference symbol B denotes a cathode separator-forming area, being an area where the cathode separators 4 are formed above the substrate 2. As shown in the figure, a plurality of connecting sections 8a is formed in the vicinity of one end portion Ba of the cathode separator-forming area B so as to be placed between the cathode separators 4, and toward the center of the substrate from the opposite ends of the cathode separators 4. The connecting section 8a forms a part of a connecting terminal 8, and is directly connected to the second electrode. The cathode separator-forming area B is an area where the cathode separators 4 are formed above the substrate 2, and more specifically stands for the whole region where the cathode separators 4 and spaces between the cathode separators 4 are present.

The first electrodes 3 and the connecting terminals 8 are extended so that one end portion 3a of the first electrode 3 and one end portion 8b of the connecting terminal 8 are positioned outside of the sealing portion 7. A data driving circuit 100 including a shift register, a level shifter, a video line, and an analog switch is connected to the one end portions 3a of the first electrodes 3, and a scanning driving circuit 101 including a shift register and a level shifter is connected to the one end portions 8b of the connecting terminals 8.

As shown in FIG. 3, each of the organic functional layers 6 includes a light-emitting layer 61 which emits light of a predetermined wavelength when electric current flows into the first electrodes 3 and the second electrodes 5 which vertically sandwich the light-emitting layer 61. The organic EL device 1 has a function as a display unit, by providing in a matrix a plurality of light-emitting areas A where the organic functional layer including such a light-emitting layer 61 is formed. In the organic EL device 1 according to the embodiment, the substrate 2 and the first electrodes 3 have translucency, and are constructed such that the light emitted from the light-emitting layer 61 is exit from the substrate 2 side. The organic functional layers 6 are, as shown in the figure, contained in spaces surrounded by sidewalls 10b of the bank layers, the first electrode 3, and the second electrode 5. As a result, deterioration of the organic functional layers 6 due to moisture and air entering from outside can be prevented.

The material for the substrate 2 having translucency includes, for example, a glass, quartz and a resin (a plastic, a plastic film), and particularly, an inexpensive soda glass substrate is preferably used. The first electrodes 3 are made of a conductive material having translucency including a metal oxide such as indium tin oxide (ITO) and indium zinc oxide (IZO) in a strip, and are formed with predetermined gaps therebetween. The first electrodes 3 have a function of injecting positive holes into the organic functional layer 6. The connecting terminals 8 are made of a metal material having conductivity in a rectangular shape, and as shown in the figure, are arranged such that the end portions 8c thereof are positioned between the cathode separators 4.

An insulating film 9 including a silicon oxide film ($SiO_2$) is formed above the substrate 2 where the first electrodes 3 and the connecting terminals 8 are formed. The insulating film 9 is patterned so that the first electrodes 3 in the light-emitting area A, the vicinity of the end portions 3a of the first electrodes 3, and the connecting sections 8a and the vicinity of the end portions 8b of the connecting terminals 8 are exposed. The insulating film 9 is also patterned so that the connecting sections 8a are positioned toward the center of the substrate 2 from the end portions 4a of the cathode separators 4 (one end portion Ba of the cathode separator-forming area B).

The bank layers 10 are formed in the cathode separator-forming area B on the insulating film 9, so as not to cover the connecting sections 8a. The bank layers 10 are made of an organic material having excellent heat resistance and solvent resistance, such as an acrylic resin or a polyimide resin, and have openings 10a formed at positions corresponding to the light-emitting areas A. The thickness of the bank layers 10 is smaller than that of the cathode separators 4, and greater than that of the organic functional layers 6.

The cathode separators 4 formed on the bank layers 10 are made of a photosensitive resin such as polyimide. A plurality of cathode separators 4 are formed having a thickness of, for example 6 μm, with the widthwise cross-section in a reversed tapered shape such that the width is gradually enlarged upward, and with a predetermined gap therebetween in the Y-axis direction along the second electrodes 5. Furthermore, as shown in the figure, the cathode separators 4 are formed such that the end portions 4b in the width direction at the upper part of the cathode separators 4 are positioned toward the outside of the light-emitting areas A from the end portions 10c (an end portion corresponding to the transverse direction in FIG. 3) of the openings 10a of the bank layers 10. The cathode separators 4 are made of a material different from that of the bank layers 10, so that the bank layers 10 are not etched at the time of forming the cathode separators 4 by the photolithographic technique.

The ends (two ends) of the respective cathode separators 4 in the lengthwise direction (X-axis direction) are connected by boundary walls (second partitions) 11 as a boundary section, which extend in the Y-axis direction and separate the film-forming areas M for the second electrodes 5 from non-film-forming areas H. In the embodiment, the boundary walls 11 are integrally formed with the cathode separators 4 with the same material.

The organic functional layer 6 is a stacked body obtained by stacking a hole injection/transportation layer 62, the light-emitting layer 61, and an electron injection/transportation layer 63, and is contained in the opening 10a of the bank layer 10. The hole injection/transportation layer 62 is made of, for example, a mixture of a polythiophene derivative such as polyethylenedioxy thiophene and polystyrene sulfonate. The hole injection/transportation layer 62 has a function of injecting positive holes into the light-emitting layer 61 and transporting the positive holes within the hole injection/transportation layer 62.

The light-emitting layer 61 includes three layers, that is, a red light-emitting layer 61a that emits a red color (R), a green light-emitting layer 61b that emits a green color (G), and a blue light-emitting layer 61c that emits a blue color (B), and the respective light-emitting layers 61a to 61c are arranged in a mosaic pattern. For the material for the light-emitting layer 61, for example, there can be used a material obtained from anthracene, pyrene, 8-hydroxyquinoline aluminum, bisstyryl anthracene derivatives, tetraphenylbutadiene derivatives, coumarin derivatives, oxadiazole derivatives, distyrylbenzene derivatives, pyrrolopyridine derivatives, perinone derivatives, cyclopentadiene derivatives, thiadiazolo pyridine derivatives, or low-molecular materials thereof doped with rubrene, a Quinacridone derivative, a phenoxazone derivative, DCM, DCJ, perinone, a perylene derivative, a coumarin derivative, or a diazaindacene derivative.

The electron injection/transportation layer 63 has a function of injecting electrons into the light-emitting layer 61, and a function of transporting the electrons within the electron injection/transportation layer 63. For the electron injection/transportation layer 63, for example, lithium quinolinol, lithium fluoride or bathophen cesium can be preferably used. Moreover, metals having a work function of 4 eV or less, for example, Mg, Ca, Ba, Sr, Li, Na, Rb, Cs, Yb and Sm can be also used.

For the second electrode 5, for example, a metal film having a high reflectance, such as an Al film or an Ag film, is used, so that the light emitted from the light-emitting layer 61 toward the second electrodes 5 is efficiently emitted toward the substrate 2. The second electrode 5 is formed so as to cover the opening 10a in the bank layer 10. A protective layer for preventing oxidation, which is formed of SiO, $SiO_2$ or SiN, may be provided on the second electrodes 5 as required.

The sealing portion 7 is made of a sealing resin 7a applied above the substrate 2 and a sealing can (sealing member) 7b. The sealing resin 7a is an adhesive for bonding the substrate 2 and the sealing can 7b, and is applied, for example, around the substrate 2 by a micro-dispenser or the like. The sealing resin 7a is formed of a thermosetting resin or an ultraviolet curable resin, and particularly, it is desired that the sealing resin 7a be made of an epoxy resin, which is one kind of the thermosetting resin. Moreover, for the sealing resin 7a, a material which does not allow oxygen and moisture to permeate therethrough is used, so that permeation of moisture or oxygen into the sealing can 7b from between the substrate 2 and the sealing can 7b is prevented, thereby preventing oxidation of the second electrodes 5 or the light-emitting layer 61.

The sealing can 7b includes a concave portion 7b1 for containing the first electrodes 3, the organic functional layers 6, and the second electrodes 5 thereinside, and is bonded to the substrate 2 via the sealing resin 7a. A gettering material for absorbing or removing oxygen and moisture may be provided, as required, outside of the cathode separator-forming area B on the inner surface of the sealing can 7b. For the gettering material, for example, alkaline metals such as Li, Na, Rb or Cs, alkaline earth metals such as Be, Mg, Ca, Sr or Ba, oxides of alkalifie earth metals, or hydroxides of alkaline metals or alkaline earth metals may preferably be used. Oxides of alkaline earth metals react with moisture to change to hydroxides, thereby acting as a dehydrating material. Alkaline metals and alkaline earth metals react with oxygen to change to oxides, as well as reacting with moisture to change to hydroxides, thereby acting not only as a dehydrating agent but also as a deoxygenating material. As a result, oxidation of the organic functional layers 6 and the like can be prevented, thereby enhancing the reliability of the apparatus.

Next, the method for manufacturing the organic EL device 1 according to the embodiment will be described, with reference to the drawings. The method for manufacturing the organic EL device 1 according to the embodiment includes, for example, (1) a first electrode forming step, (2) an insulating film forming step, (3) a bank layer forming step, (4) a cathode separator and boundary wall forming step, (5) a plasma processing step, (6) a hole injection/transportation layer forming step, (7) a light-emitting layer forming step, (8) an electron injection/transportation layer forming step, (9) a second electrode forming step, and (10) a sealing step. The manufacturing method is not limited to these steps, and some of them may be removed, or another step may be added, according to requirement.

(1) First Electrode Forming Step

Figure 4A:
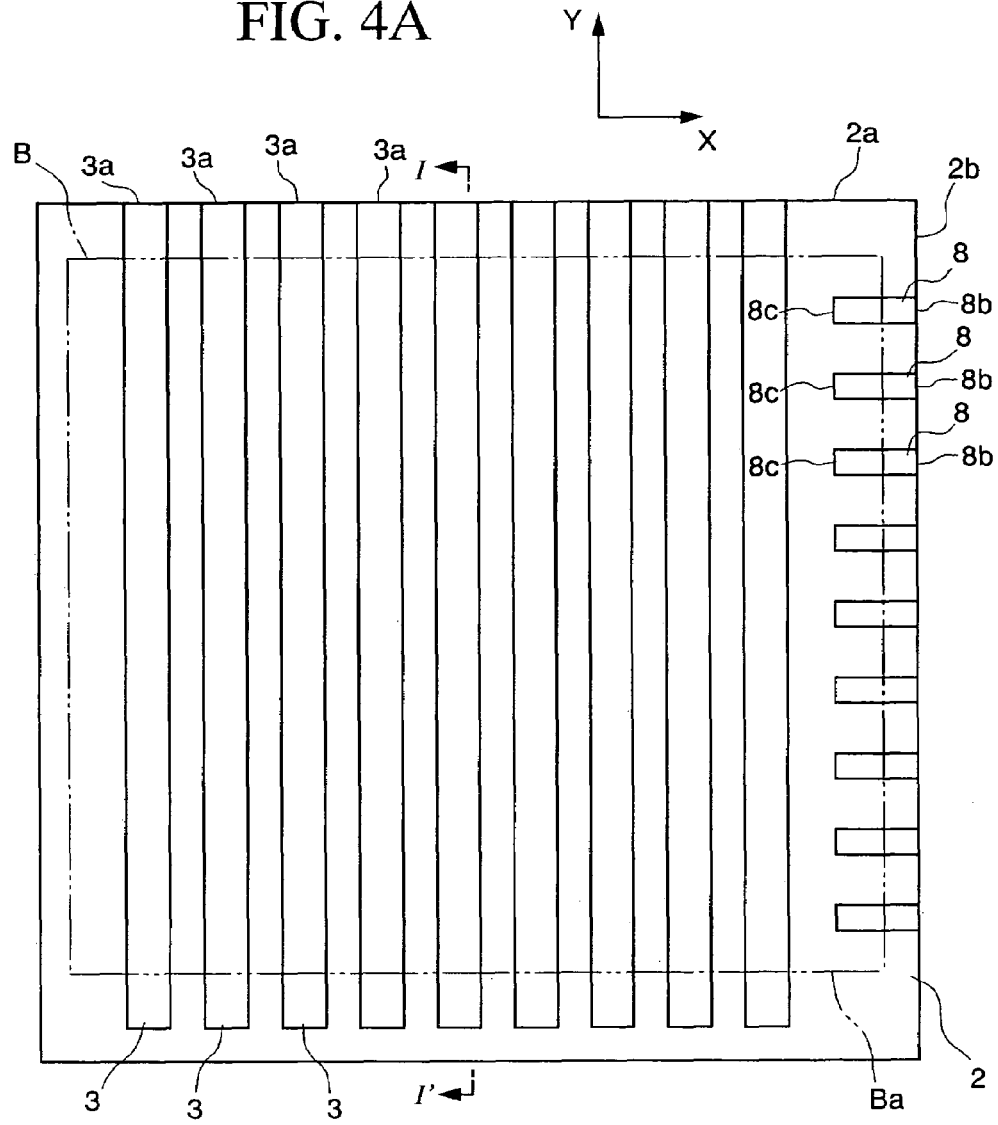
FIG. 4A is a plan view showing a method for manufacturing the organic EL device.
Figure 4B:
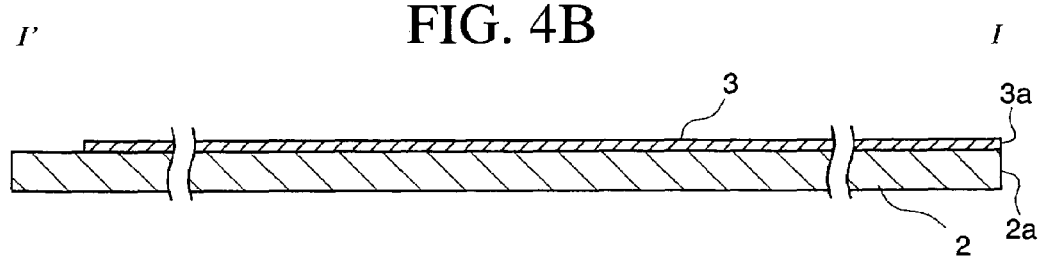
FIG. 4B is a cross-sectional view showing the method for manufacturing the organic EL device.

The first electrode forming step is forming a plurality of first electrodes 3 extending in the Y-axis direction in a strip shape above the substrate 2. In this first electrode forming step, as shown in FIGS. 4A and 4B, the first electrodes 3 including a metal oxide, such as ITO or IZO, are formed above the substrate 2 by sputtering. As a result, strip-shape first electrodes 3 are formed with a predetermined gap therebetween in the X-axis direction, and the one ends 3a thereof (the upper side in FIG. 4A) are formed so as to reach the end portion 2a of the substrate 2. In the first electrode forming step, the connecting terminals 8 are also formed. The connecting terminals 8 are formed, as shown in the figure, such that the one ends 8b thereof reach the end portion 2b of the substrate 2, and the other ends 8c are positioned toward the center of the substrate 2 from the end portion Ba of the bank-forming area B.

(2) Insulating Film Forming Step

Figure 5A:
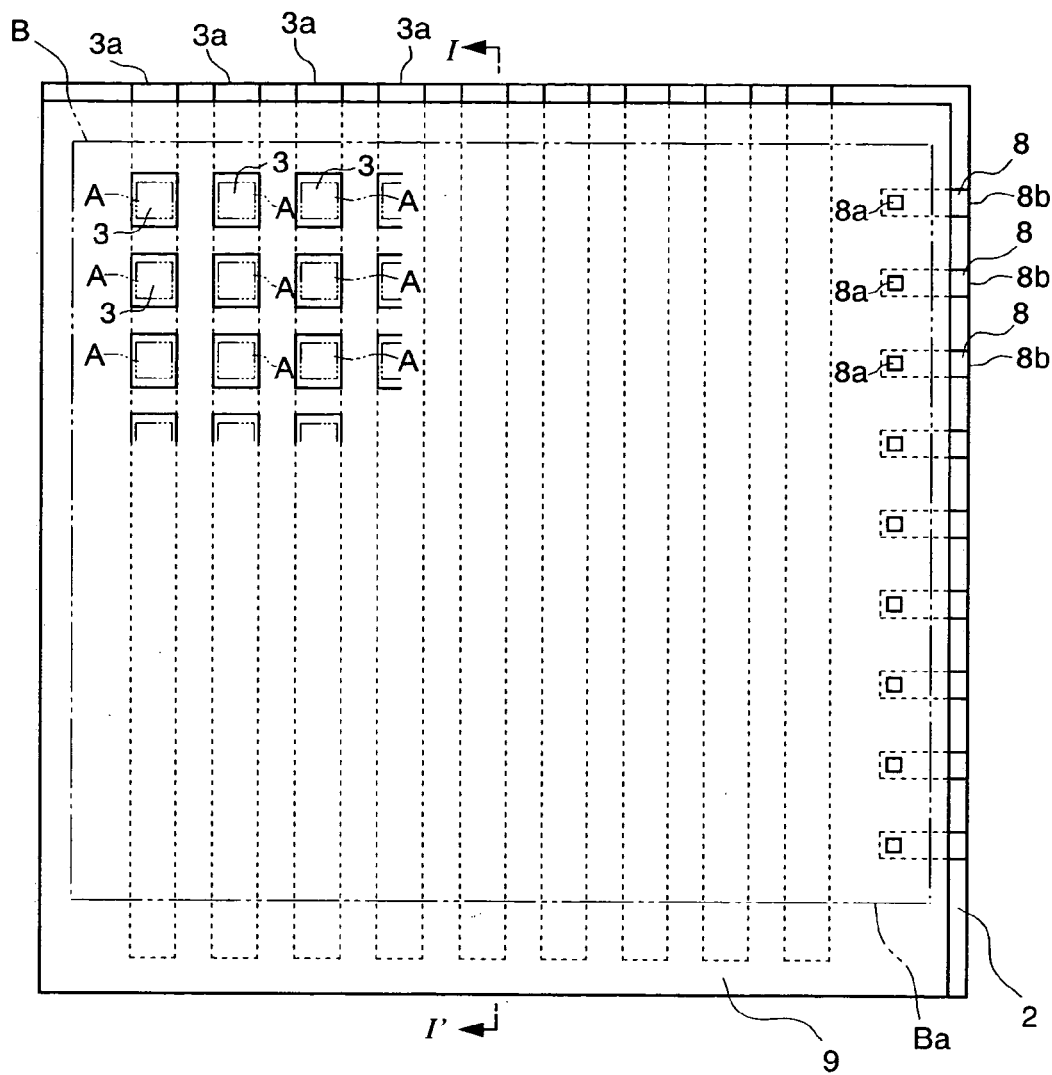
FIG. 5A is a plan view showing a method for manufacturing the organic EL device.
Figure 5B:
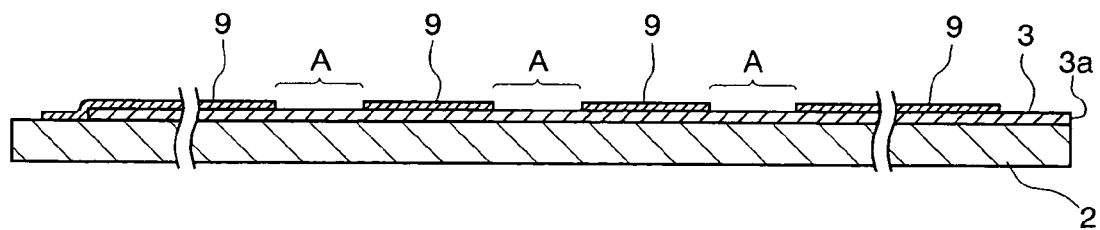
FIG. 5B is a cross-sectional view showing the method for manufacturing the organic EL device.

As shown in FIGS. 5A and 5B, the insulating film forming step is forming the insulating film 9 patterned so that the first electrodes 3 in the light-emitting area A, the vicinity of the end portions 3a of the first electrodes 3, the connecting sections 8a, and the vicinity of the end portions 8b of the connecting terminals 8 are exposed above the substrate 2, the first electrodes 3, and the connecting terminals 8.

In this insulating film forming step, the insulating film 9 is formed by the plasma CVD method by using tetraethoxysilane and an oxygen gas as a raw material. The insulating film 9 is patterned so that the connecting sections 8a are positioned toward the center of the substrate 2 from the end portion Ba of the cathode separator-forming area B.

(3) Bank Layer Forming Step

Figure 6A:
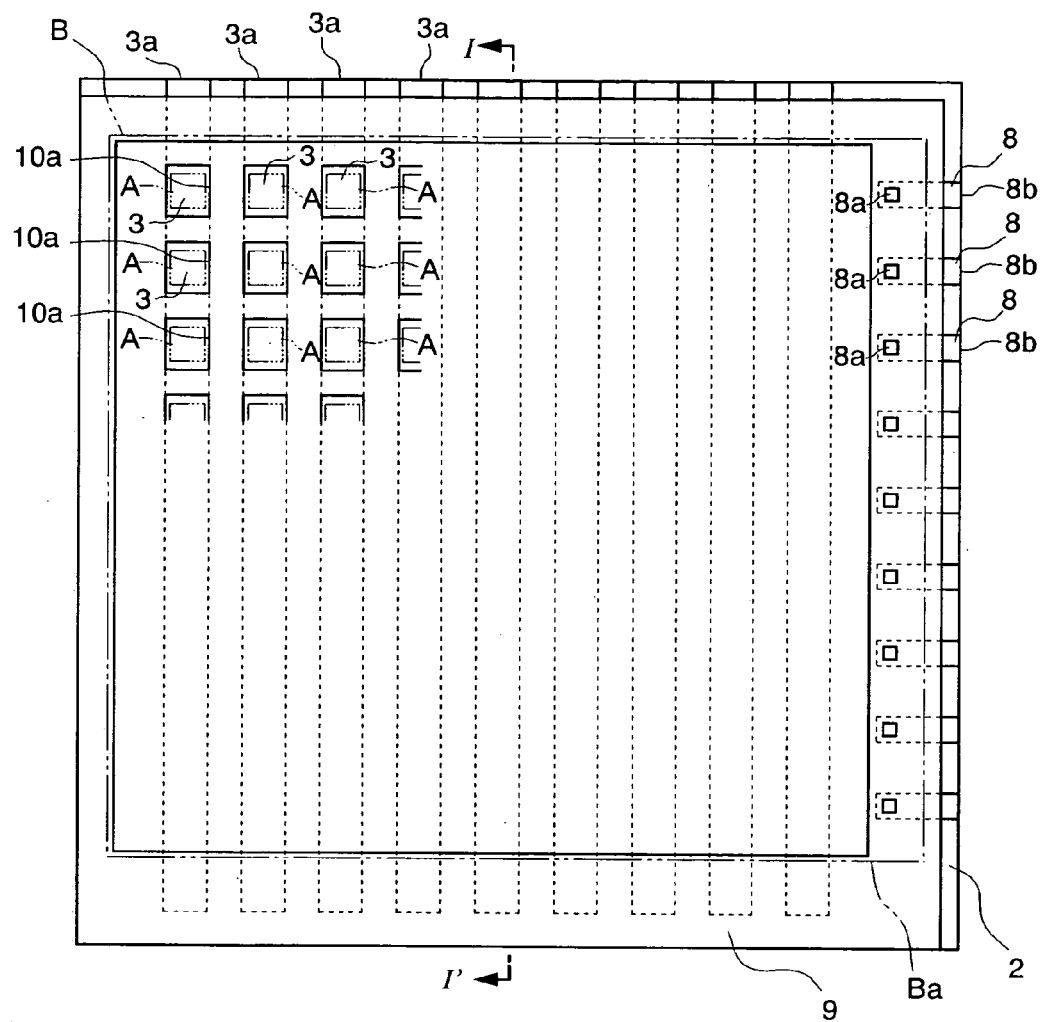
FIG. 6A is a plan view showing a method for manufacturing the organic EL device.
Figure 6B:
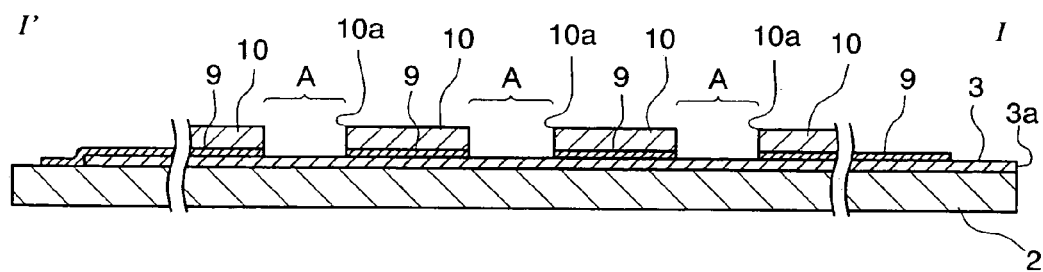
FIG. 6B is a cross-sectional view showing the method for manufacturing the organic EL device.

The bank layer forming step is, as shown in FIGS. 6A and 6B, forming the bank layers 10, in which the openings 10a are formed at positions corresponding to the light-emitting areas A in the cathode separator-forming area B, and so as not to cover the connecting sections 8a. In the bank layer forming step, a photosensitive material (organic material) having heat resistance and solvent resistance such as an acrylic resin or a polyimide resin is applied on the substrate on which the first electrodes 3 and the insulating film 9 are formed, in a thickness larger than that of the organic functional layers 6 and smaller than that of the cathode separators 4, to form the openings 10a at positions corresponding to the light-emitting areas A by the photolithographic technique.

(4) Cathode Separator and Boundary Wall Forming Step

Figure 7A:
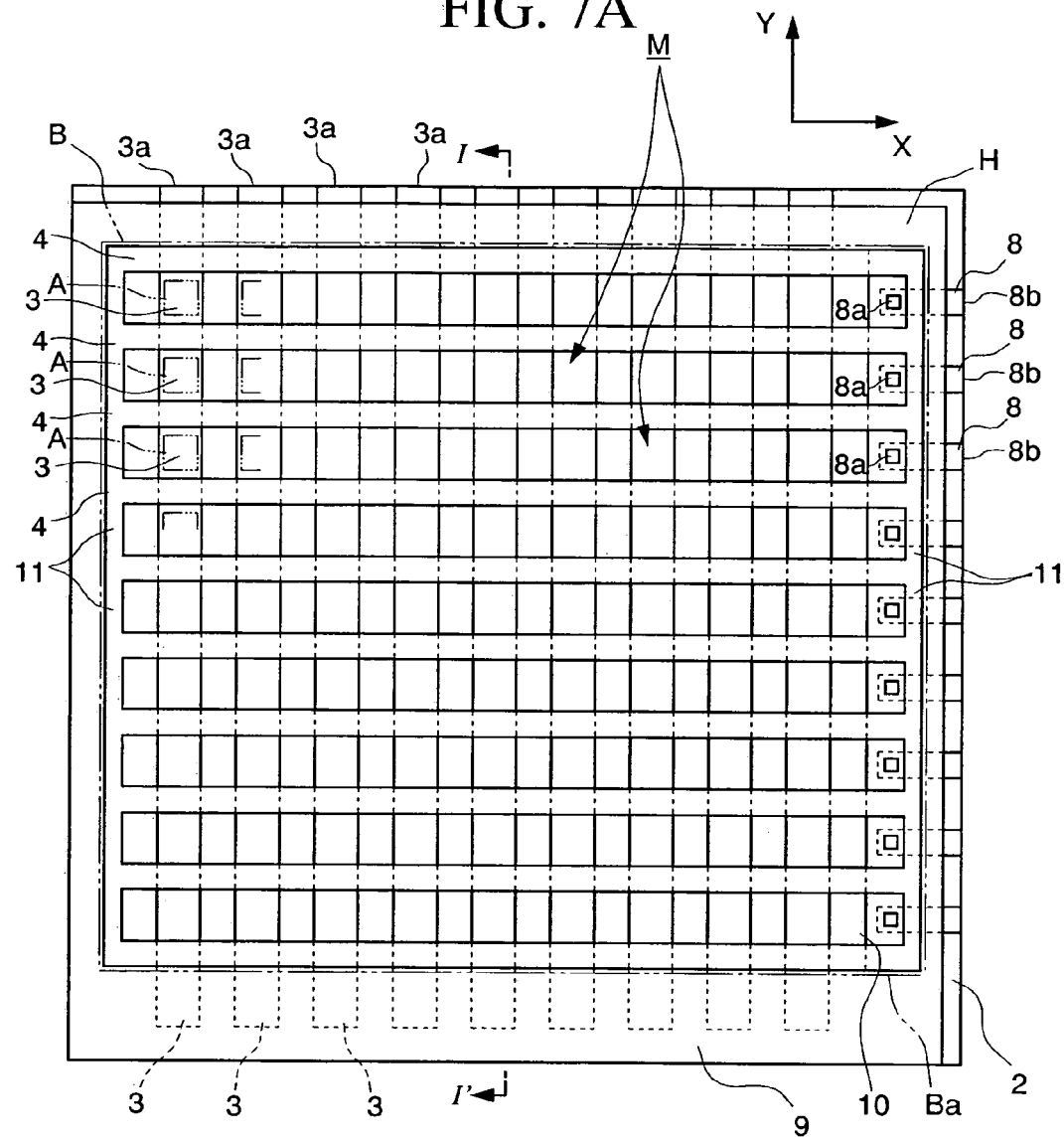
FIG. 7A is a plan view showing a method for manufacturing the organic EL device.
Figure 7B:
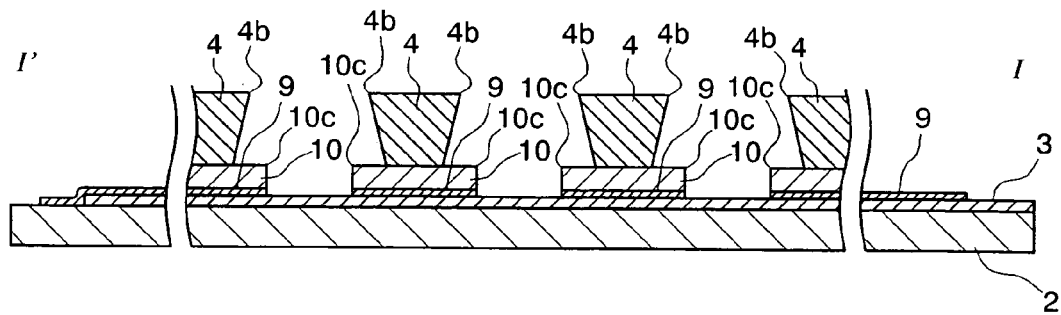
FIG. 7B is a cross-sectional view showing the method for manufacturing the organic EL device.

The cathode separator and boundary wall forming step is, as shown in FIGS. 7A and 7B, forming a plurality of cathode separators 4 extending in a direction orthogonal to the extending direction of the first electrodes (in the X-axis direction) in a strip shape, on two sides sandwiching the film forming areas M, with a predetermined interval, and forming the boundary walls 11 which connect the end portions of the separators 4, and separate the film forming areas M for the second electrodes 5. In the cathode separator and boundary wall forming step, a photosensitive resin such as polyimide is applied above the substrate 2 by spin coating or the like in a predetermined thickness. The photosensitive resin such as polyimide applied in a predetermined thickness is then etched by the photolithographic technique, to form in the same step in the cathode separator-forming area B, a plurality of boundary walls 11, and a plurality of cathode separators 4 with the cross sectional shape in the width direction set to a reversed tapered shape. The cathode separators 4 are formed such that the connecting sections 8a are positioned between the cathode separators 4, and the end portion 4b of the cathode separator 4 in the width direction is positioned toward the outside of the light-emitting area A from the end portion 10c of the bank layer 10.

(5) Plasma Processing Step

The plasma processing step is performed in order to activate the surface of the first electrodes 3, and to treat the surface of the bank layers 10, the cathode separators 4, and the boundary walls 11. Specifically, as is well known, $O_2$ plasma processing is first performed to thereby clean the exposed first electrodes 3 (ITO) and adjust the work function, and further to provide the surface of the bank layers 10, the surface of the exposed first electrodes 3, and the surfaces of the cathode separators 4 and the boundary walls 11 an affinity with liquid. Subsequently, $CF_4$ plasma processing is performed to make the surfaces of the bank layers 10, the cathode separators 4, and the boundary walls 11 liquid-repellent.

(6) Hole Injection/Transportation Layer Forming Step

Figure 8A:
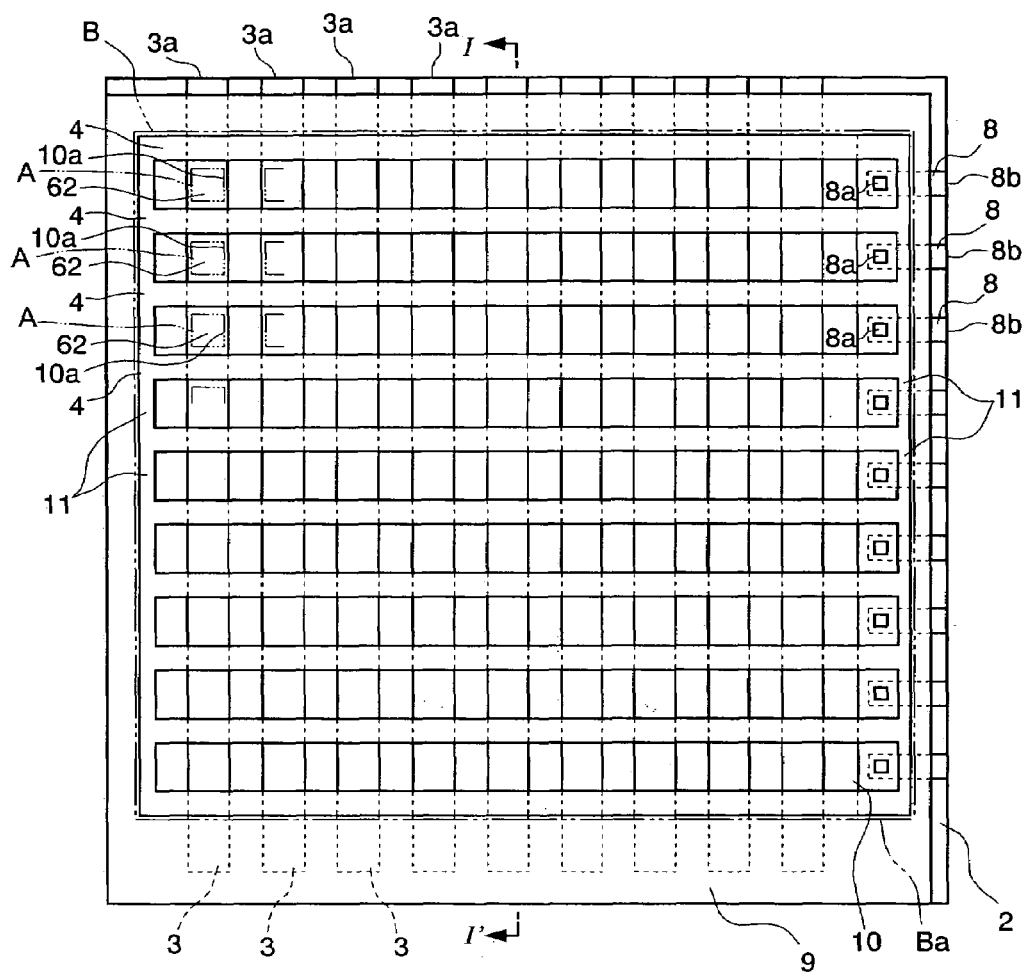
FIG. 8A is a plan view showing a method for manufacturing the organic EL device.
Figure 8B:
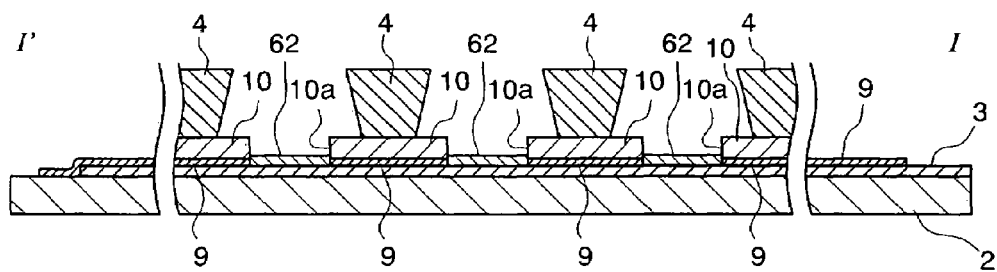
FIG. 8B is a cross-sectional view showing the method for manufacturing the organic EL device.

The hole injection/transportation layer forming step is forming the hole injection/transportation layer 62 on the exposed first electrodes 3, that is, in the openings 10a in the bank layers 10, by the droplet ejection method. In this hole injection/transportation layer forming step, a material for the hole injection/transportation layer is ejected onto the first electrodes 3 by using, for example, an ink jet device. Thereafter, the hole injection/transportation layer 62 as shown in FIGS. 8A and 8B is formed on the first electrodes 3 by performing drying processing and heat treatment.

The ink jet device ejects the material from a ejecting nozzle provided in an ink jet head, with the liquid amount per drop being controlled, and ejects the material onto a ejection surface by making the ejecting nozzle face the ejection surface and relatively shifting the ejecting nozzle and the substrate 2. At this time, since the surface of the bank layer 10 is made liquid-repellent by the plasma processing step, even if the material ejected from the ejecting nozzle adheres on the upper face of the bank layers, the material reliably enters into the openings 10a in the bank layers 10.

(7) Light-Emitting Layer Forming Step

Figure 9A:
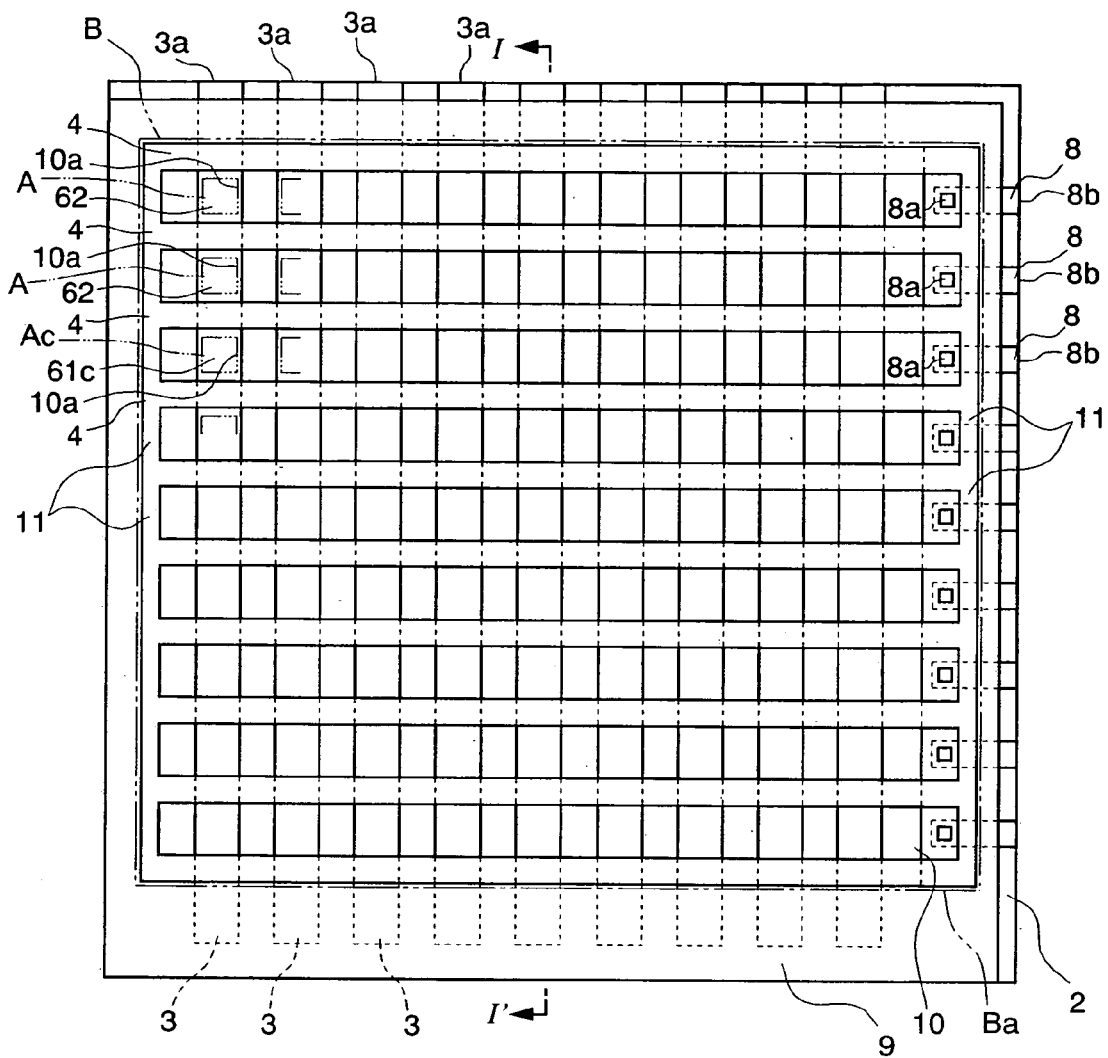
FIG. 9A is a plan view showing a method for manufacturing the organic EL device.
Figure 9B:
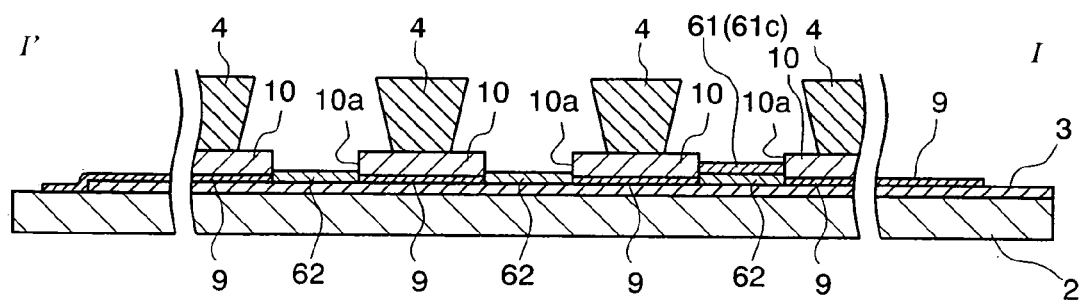
FIG. 9B is a cross-sectional view showing the method for manufacturing the organic EL device.
Figure 10A:
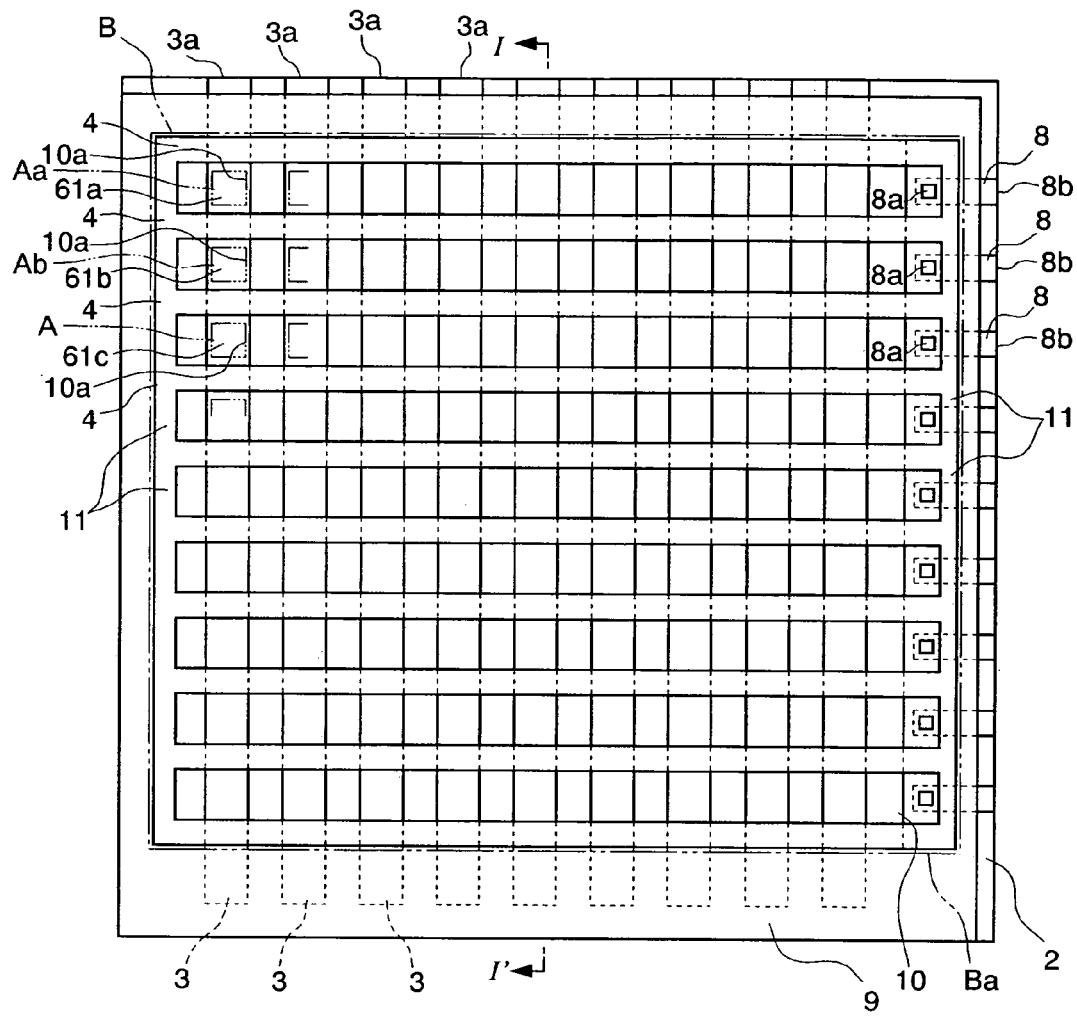
FIG. 10A is a plan view showing a method for manufacturing the organic EL device.
Figure 10B:
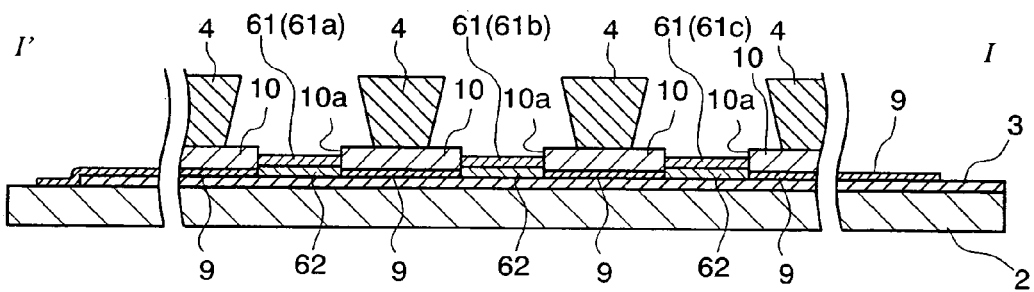
FIG. 10B is a cross-sectional view showing the method for manufacturing the organic EL device.

The light-emitting layer forming step is forming the light-emitting layer 61 including a low-molecular material, on the hole injection/transportation layer 62 formed on the first electrodes 3, as shown in FIGS. 9A and 9B, and FIGS. 10A and 10B. In the light-emitting layer forming step, at first, a blue light-emitting layer material is ejected into the openings 10a in the bank layers 10 corresponding to a blue light-emitting area Ac by the droplet ejection method using, for example, an ink jet device, to form a blue light-emitting layer 61c as shown in FIGS. 9A and 9B. Subsequently, a red light-emitting layer material is ejected into the openings 10a in the bank layers 10 corresponding to a red light-emitting area Aa, to form a red light-emitting layer 61a, and a green light-emitting layer material is ejected into the openings 10a in the bank layers 10 corresponding to a green light-emitting area Ab, to form a green light-emitting layer 61b (see FIGS. 10A and 10B).

(8) Electron Injection/Transportation Layer Forming Step

Figure 11A:
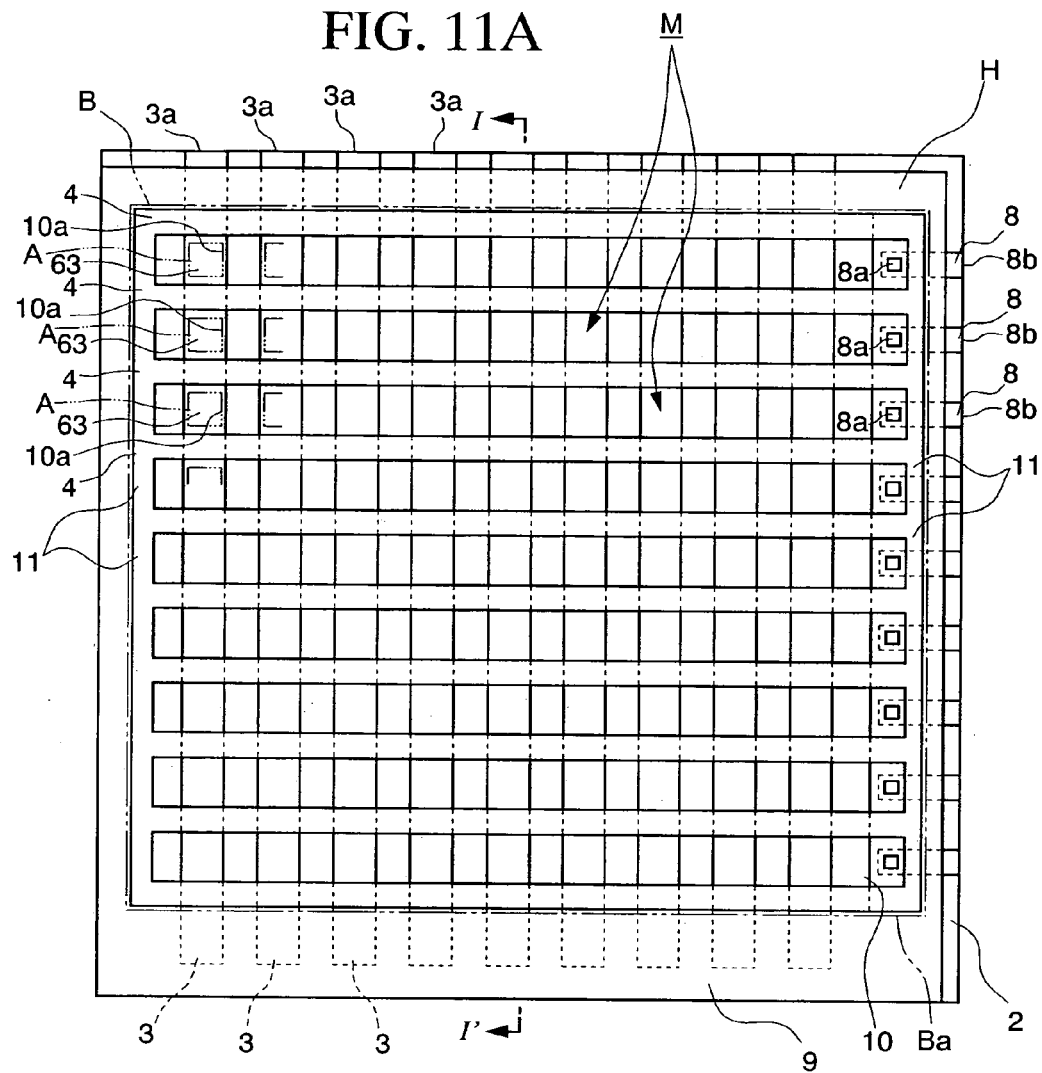
FIG. 11A is a plan view showing a method for manufacturing the organic EL device.
Figure 11B:
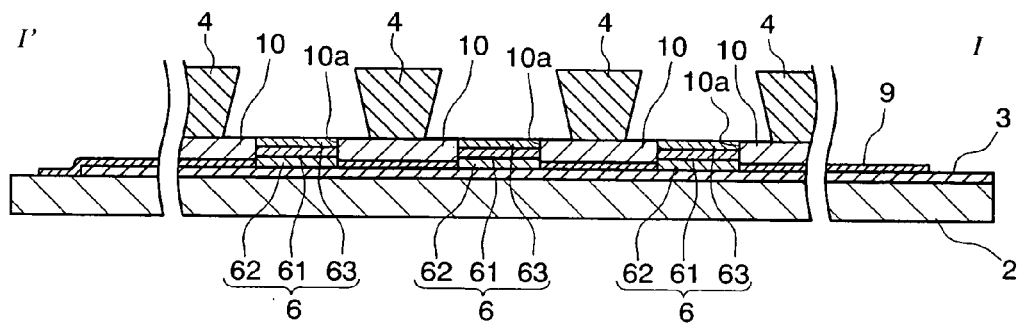
FIG. 11B is a cross-sectional view showing the method for manufacturing the organic EL device.

The electron injection/transportation layer forming step is forming the electron injection/transportation layer 63 on the light-emitting layer 61, as shown in FIGS. 11A and 11B. In this electron injection/transportation layer forming step, a material for the electron injection/transportation layer is ejected onto the light-emitting layer 61 by the droplet ejection method using, for example, an ink jet device, to thereby form the electron injection/transportation layer 63. The hole injection/transportation layer forming step, the light-emitting layer forming step, and the electron injection/transportation layer forming step together constitute an organic functional layer forming step.

Thus, the organic functional layers 6, which are a stacked body of the hole injection/transportation layer 62, the light-emitting layer 61, and the electron injection/transportation layer 63, are formed by ejecting the materials therefor into the openings 10*a* in the bank layers 10 by the droplet ejection method. Therefore, swelling of the organic functional layers 6 along the sides of the cathode separators 4 can be prevented.

(9) Second Electrode Forming Step

Figure 12A:
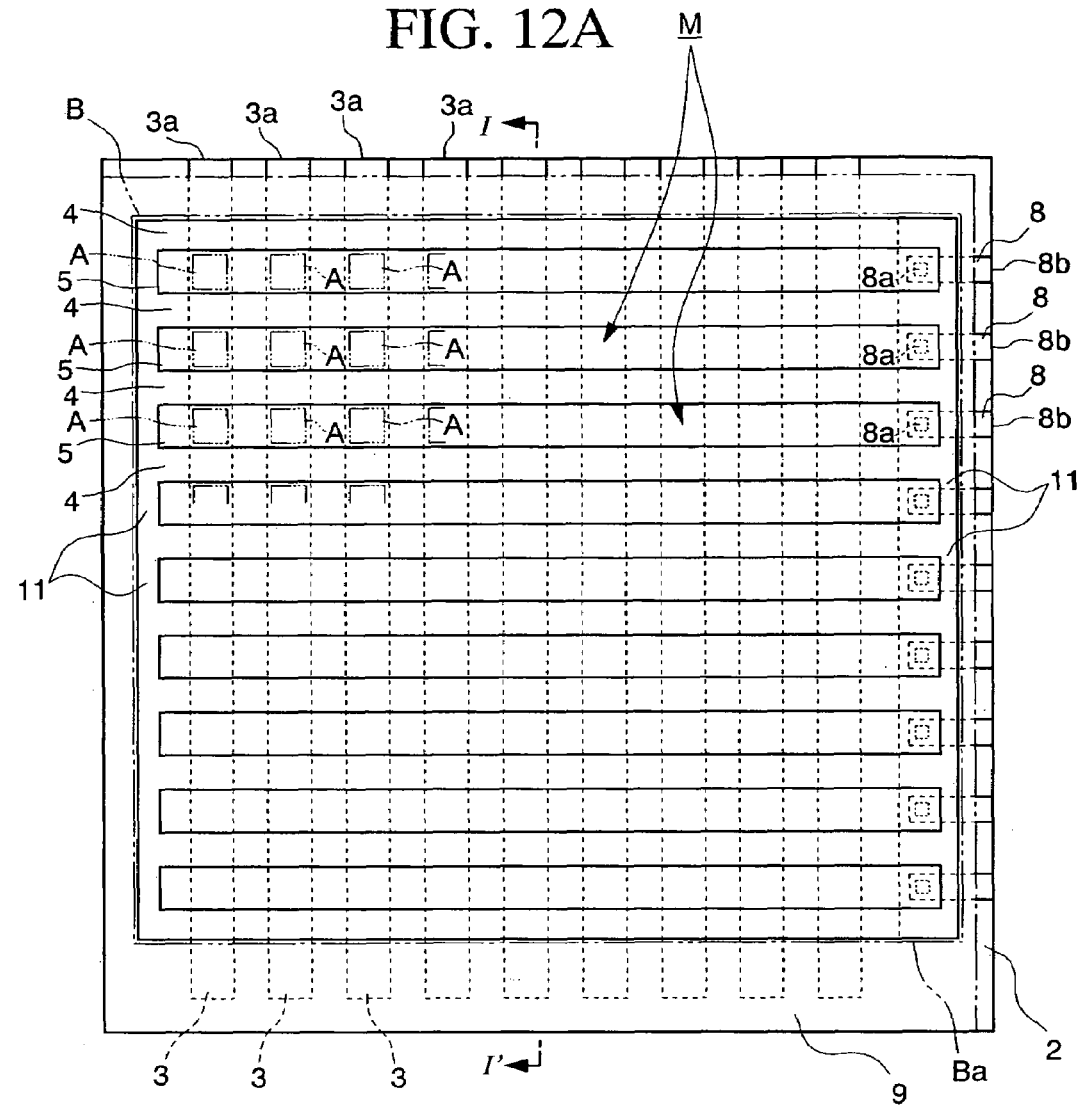
FIG. 12A is a plan view showing a method for manufacturing the organic EL device.
Figure 12B:
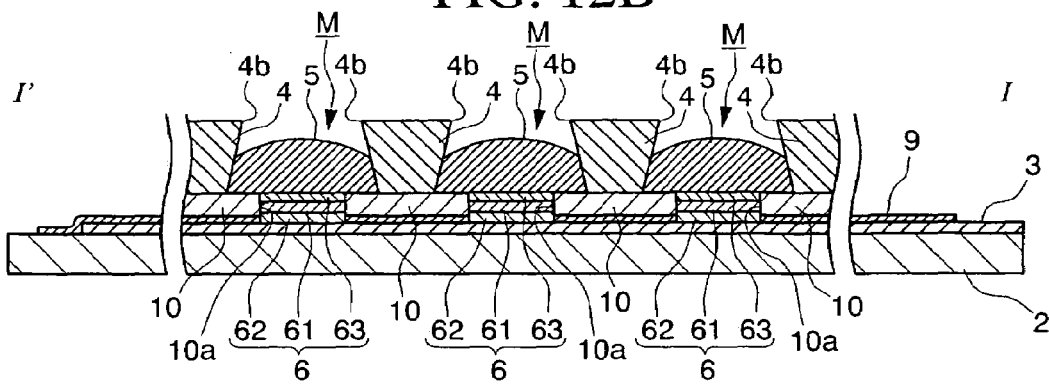
FIG. 12B is a cross-sectional view showing the method for manufacturing the organic EL device.

The second electrode forming step is forming the second electrodes 5 in the film forming areas M between the adjacent cathode separators 4, as shown in FIGS. 12A and 12B. In the second electrode forming step, the second electrodes 5 are formed by ejecting droplets including an electrode-forming material (for example, a metal dispersion-type ink) into the film forming areas M by the droplet ejection method using an ink jet device. At this time, the film forming areas M are surrounded by the cathode separators 4 in the Y-axis direction, and surrounded by the boundary walls 11 in the X-axis direction. Therefore, the ejected droplets are fitted in the respective film-forming areas M, and contact between droplets in the adjacent film-forming areas M is avoided.

Thereafter, the second electrodes 5 as shown in FIG. 3 are formed on the organic functional layers 6 by performing drying processing and heat treatment.

Since the second electrodes 5 are formed using the droplet ejection method, the second electrodes 5 can be easily formed so as to cover the openings 10*a* in the bank layers 20. As a result, the organic functional layers 6 are fitted in the space surrounded by the bank layers 10, the first electrodes 3, and the second electrodes 5. Thus, since the organic functional layers 6 can be protected from moisture and air entering from the outside, deterioration of the organic functional layers 6 can be prevented, thereby obtaining excellent emission lifetime.

Since the connecting section 8*a* is positioned in the film forming area M surrounded by the cathode separators 4 and the boundary walls 11, a film of the second electrode material is formed also on the connecting sections 8*a* by the second electrode forming step using the droplet ejection method. As a result, the connecting sections 8*a* and the second electrodes 5 are directly connected by the second electrode forming step. Thus, the second electrodes 5 and the connecting sections 8*a* can be connected by only the second electrode forming step.

(10) Sealing Step

Lastly, the sealing can 7*b*, and the substrate 2 on which the first electrodes 3, the organic functional layers 6 and the second electrodes 5 are formed according to the above described steps, are sealed via the sealing resin 7*a*. For example, the sealing resin 7*a* including a thermosetting resin or an ultraviolet curable resin is applied on the periphery of the substrate 2, and the sealing can 7*b* is arranged on the sealing resin (see FIG. 3). Preferably the sealing step is performed in an atmosphere of inert gas such as nitrogen, argon or helium. If the sealing step is performed in air, then in the case where a defect such as a pinhole has occurred in the second electrodes 5, moisture, oxygen and the like may enter into the second electrodes 5 from the defect portion, if any, to oxidize the second electrodes 5. Hence sealing in air is not desirable.

Thereafter, the data driving circuit 100 provided above the substrate 2 or outside of the substrate 2, and the first electrodes 3 are connected, and the scanning driving circuit 101 provided above the substrate 2 or outside of the substrate 2, and the second electrodes 5 are connected, thereby completing the formation of the organic EL device 1 of the embodiment.

In the embodiment, since the film forming area M is separated from the non-film forming area H by the boundary walls 11, at the end portions of the cathode separators 4, it is possible to prevent the ejected material for forming the second electrodes 5 from flowing out from the film forming area M, and droplets in the adjacent film forming area M coming in contact with each other. Therefore, it is possible to prevent the adjacent second electrodes 5 from being electrically connected and short-circuited. In the embodiment, since the boundary walls 11 are formed together with the cathode separators 4 in the same step, the manufacturing steps can be reduced, thereby contributing to an improvement in productivity.

In the embodiment, the configuration is such that the cathode separators 4 serving as partitions are formed in a reversed tapered shape as the most preferable shape. However, the configuration may be such that the cathode separators 4 are formed in a normal tapered shape, with the width thereof gradually decreasing upward, or are formed perpendicularly upright (in a cubic shape).

Second Embodiment

A second embodiment of the method for manufacturing the organic EL device according to the present invention will be described next.

In the above-described first embodiment, the boundary wall 11 is provided as a boundary section which separates the film-forming areas M. However in the second embodiment, a case in which a liquid-repellent film is used as the boundary section will be described.

Figure 13:
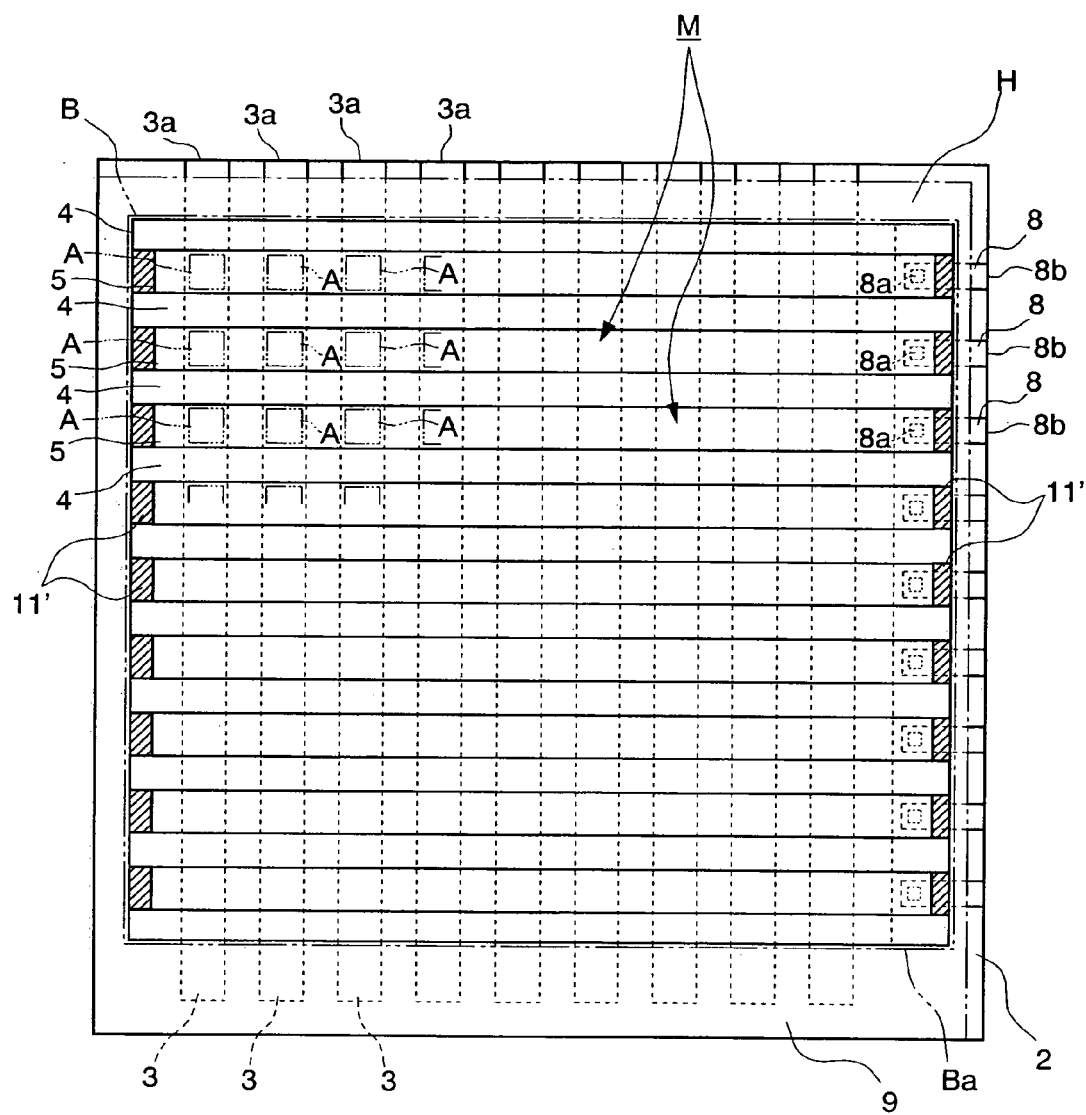
FIG. 13 is a diagram showing the method for manufacturing the organic EL device.

As shown in FIG. 13, in this embodiment, a liquid-repellent film (boundary section) 11' having liquid repellency with respect to droplets of the electrode forming material, is formed between the end portions of the cathode separators in the lengthwise direction, and the film forming area M is separated from the non-film forming area H by the liquid-repellent film 11'.

The liquid-repellent film 11' can be formed by plasma processing or the like.

The droplets including the electrode forming material ejected into the film forming area M are prevented from flowing out from the film forming area M by the liquid-repellent film 11', thereby preventing the adjacent second electrodes 5 from being electrically connected and short-circuited.

In FIG. 13, the liquid-repellent film 11' is provided only in the boundary portions (hatched areas) between the film forming area M and the non-film forming area H. However, the liquid-repellent film may be formed in the entire non-film forming area H.

Third Embodiment

A specific example of an electronic apparatus of the present invention will be described as a third embodiment.

Figure 14A:
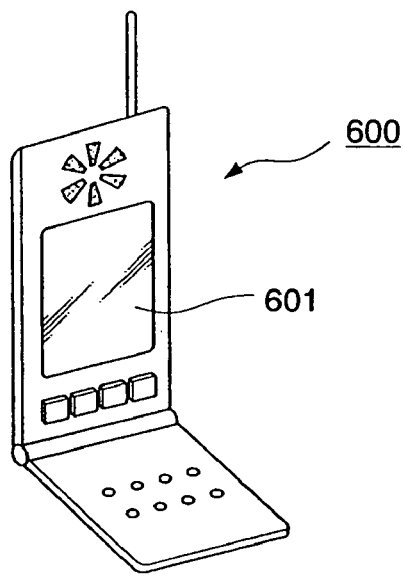
FIGS. 14A to 14C are diagrams showing specific examples of an electronic apparatus of the present invention.

FIG. 14A is a perspective view showing one example of a mobile phone. In FIG. 14A, reference symbol 600 denotes a mobile phone body, and 601 denotes a display section having the organic EL device 1 of the above embodiments.

Figure 14B:
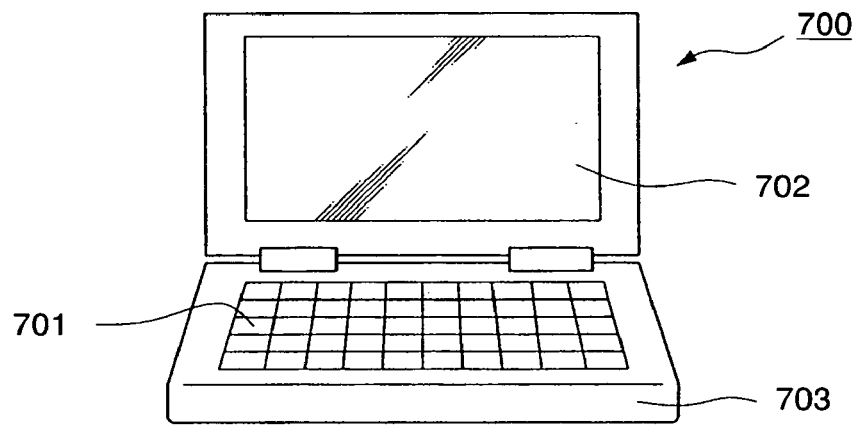

FIG. 14B is a perspective view showing one example of a portable information processor such as a word processor or a personal computer. In FIG. 14B, reference symbol 700 denotes an information processor, 701 denotes an input section such as a keyboard, 703 denotes an information processor body, and 702 denotes a display section having the organic EL device 1 of the above embodiments.

Figure 14C:
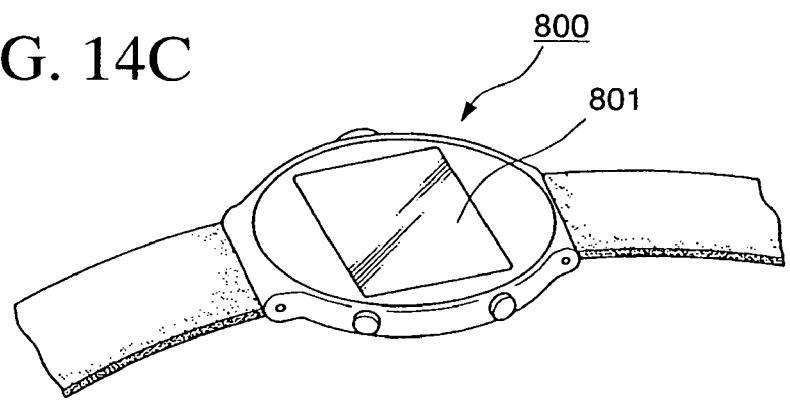

FIG. 14C is a perspective view showing one example of a wristwatch-type electronic apparatus. In FIG. 14C, reference symbol 800 denotes a watch body, and 801 denotes a display section having the organic EL device 1 of the above embodiments.

Since the electronic apparatus shown in FIGS. 14A to 14C includes the organic EL device 1 according to the above embodiments, the film-formed electrode is not short-circuited, and the electronic apparatus has excellent display quality without causing luminance unevenness.

Preferred embodiments according to the present invention have been described above with reference to the accompanying drawings, but the present invention is not limited to the examples shown above. The shapes of the respective components and the combination thereof shown in the above examples are merely exemplary, and can be variously changed based on design requirements and the like, without departing from the scope of the present invention.

For example, in the second electrode forming step in the manufacturing method described above, an electrode having a greater film thickness can be formed by repeating the step of ejecting the droplets including the electrode forming material, and the step of drying the ejected droplets.

Further, in the above embodiments, a low-molecular material is used as the light-emitting layer 61, but a high-molecular material may be used. As the high-molecular material for the light-emitting layer, there can be used (poly)paraphenylene vinylene derivatives, polyphenylene derivatives, polyfluorene derivatives, polyvinyl carbazole, polythiophene derivatives, perylene pigments, coumarin pigments, rhodamine pigments, or these high-molecular materials doped with rubrene, perylene, 9,10-diphenylanthracene, tetraphenylbutadiene, Nile red, coumarin 6, Quinacridone or the like.

What is claimed is:

1. A method for manufacturing an organic electroluminescence device having light-emitting areas, comprising:

forming a bank layer having openings formed therein above a substrate, said openings corresponding to said light-emitting areas;

forming partitions sandwiching a film-forming area above said substrate on said bank layer, the partitions extending in a first direction;

forming a boundary section between said partitions and in a proximity to end portions of said partitions, the boundary section extending in a second direction that is different from the first direction; and ejecting droplets containing an electrode forming material into said film-forming area defined by said partitions and said boundary section.

2. The method for manufacturing an organic electroluminescence device, according to claim 1, wherein said boundary section is a liquid-repellent film having liquid repellency with respect to said droplets.

3. The method for manufacturing an organic electroluminescence device, according to claim 1, wherein said boundary section is a second partition, which connects end portions of said partitions arranged sandwiching said film-forming area.

4. The method for manufacturing an organic electroluminescence device, according to claim 3, wherein said partitions and said second partition, are formed in a same step.

5. The method for manufacturing an organic electroluminescence device, according to claim 1, wherein said partitions are formed in a reversed tapered shape, with a width of the partitions gradually enlarged upward from the substrate.

6. The method for manufacturing an organic electroluminescence device, according to claim 1, further comprising drying and baking said ejected droplets, wherein ejecting said droplets into said film-forming area and drying and baking said ejected droplets are repeated several times.

7. An electronic apparatus provided with an organic electroluminescence device manufactured by the manufacturing method according to claim 1.

8. The method for manufacturing an organic electroluminescence device according to claim 1, wherein the first direction is perpendicular to the second direction.

* * * * *